(12) United States Patent
Ono et al.

(10) Patent No.: US 7,050,779 B2
(45) Date of Patent: May 23, 2006

(54) SEMICONDUCTOR INTEGRATED CIRCUIT DEVICE

(75) Inventors: Ikuya Ono, Takasaki (JP); Kazuhiro Tagawa, Tamamura (JP); Satoru Takahashi, Takasaki (JP)

(73) Assignees: Hitachi, Ltd., Tokyo (JP); Akita Electronics Systems Co., Ltd., Akita (JP)

( * ) Notice: Subject to any disclaimer, the term of this patent is extended or adjusted under 35 U.S.C. 154(b) by 478 days.

(21) Appl. No.: 10/401,597

(22) Filed: Mar. 31, 2003

(65) Prior Publication Data

US 2004/0180643 A1 Sep. 16, 2004

(30) Foreign Application Priority Data

Mar. 12, 2003 (JP) .............................. 2003-066628

(51) Int. Cl.
*H04B 1/28* (2006.01)
*H04B 1/26* (2006.01)

(52) U.S. Cl. ...................... 455/333; 455/323; 455/339; 455/253.2

(58) Field of Classification Search ................ 455/313, 455/323, 324, 325, 326, 333, 334, 341, 232.1, 455/234.1, 240.1, 245.1, 250.1, 252.1, 253.2; 327/113, 119, 356, 357; 375/344, 345
See application file for complete search history.

(56) References Cited

U.S. PATENT DOCUMENTS

| 5,758,271 | A  | * | 5/1998 | Rich et al. ............... 455/234.1 |
| 6,230,001 | B1 | * | 5/2001 | Wyse ......................... 455/326 |
| 6,696,879 | B1 | * | 2/2004 | O'Toole et al. ............. 327/356 |
| 6,763,228 | B1 | * | 7/2004 | Prentice et al. .......... 455/127.2 |

* cited by examiner

*Primary Examiner*—Quochien B. Vuong
(74) *Attorney, Agent, or Firm*—Mattingly, Stanger, Malur & Brundidge, P.C.

(57) ABSTRACT

The thermal interference due to the self heating of transistors constituting a gilbert cell circuit is reduced, thereby largely improving the receiving sensitivity to signals. A mixer circuit composed of a gilbert cell circuit comprises transistors T1 to T6. Each of the transistors T1 to T4 is con figured so that four transistors may be connected in parallel. In a layout on a semiconductor chip, four transistors T1a to T1d and T2a to T2d respectively constituting the transistors T1 and T2 are respectively separated into two pairs, and the respective two pairs are laid out in a crisscross shape so that they are crossed with each other. Similarly, four transistors T3a to T3d and T4a to T4d respectively constituting the transistors T3 and T4 are respectively separated into two pairs, and the respective two pairs are laid out in a crisscross shape so that they are crossed with each other. Thus, the thermal influence applied on the transistors T1 to T4 is uniformed.

11 Claims, 11 Drawing Sheets

SEMICONDUCTOR INTEGRATED CIRCUIT DEVICE

BACKGROUND OF THE INVENTION

The present invention relates to a technique for transmitting/receiving radio signals and particularly to a technique effectively applied to the improvement of receiving sensitivity in a cellular phone and the like which use a direct conversion system.

In recent years, a cellular phone has been in widespread use as a device for mobile communication, and there have been increasing demands for a wide variety of functions in the cellular phone. With an aim to reduce the number of electronic parts and the area of a printed wiring board, some cellular phones employ a direct conversion system in a receiving unit of a semiconductor integrated circuit device for a RF (radio frequency) processing.

In the direct conversion system, small signals with a band of 800 MHz to 2 GHz, received by an antenna, are directly converted into signals with a voice band (of about several tens KHz) by the use of one mixer circuit.

SUMMARY OF THE INVENTION

However, the inventor of the present invention has found that the above-mentioned signal conversion technique based on the direct conversion system in the cellular phone and the like has the following problems.

Figure 13:
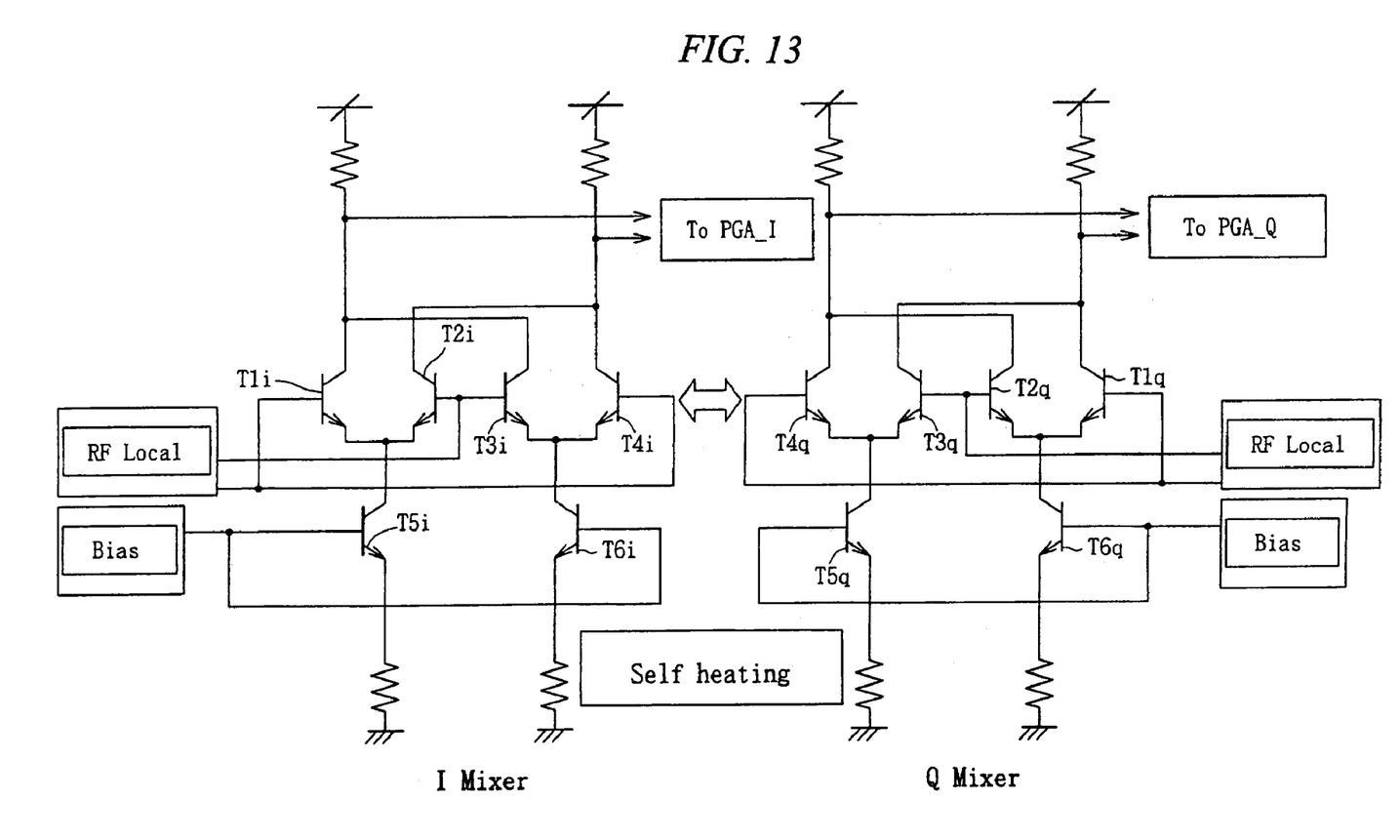
FIG. 13 is an equivalent circuit diagram of a mixer section in a receiving unit of a semiconductor integrated circuit device for a RF processing examined by the inventor of the present invention.

FIG. 13 is an equivalent circuit diagram of a mixer section in a receiving unit of a semiconductor integrated circuit device for the RF (radio frequency) processing examined by the inventor of the present invention. As shown in FIG. 13, the mixer section includes an I mixer composed of transistors T1$i$ to T6$i$ and a Q mixer composed of transistors T1$q$ to T6$q$, these I mixer and Q mixer each having a so-called gilbert cell configuration.

A current does not flow through the mixer section except a receiving mode, and a current starts to flow through it upon becoming the above-mentioned receiving mode. The transistors T1$i$ to T6$i$ and T1$q$ to T6$q$ are self-heated due to the current flowing through them.

In the layout on a semiconductor chip, the I mixer and Q mixer are laid out adjacent to each other. However, the influence on the transistors around them due to the self heating is not equivalent depending on the layout of the transistors. Therefore, a problem arises such that the DC offset occurs, which results in the deterioration of the receiving sensitivity, and the like.

For example, the transistor T4$i$ of the I mixer, which is laid out closest to the transistor T4$q$ of the Q mixer, is inevitably affected thermally by the above-mentioned transistor T4$q$ and the transistor T3$i$ of the I mixer.

Meanwhile, the transistor T1$i$ of the I mixer, laid out farthest from the transistor T4$q$ of the Q mixer, is just affected thermally by the transistor T2$i$ of the same I mixer.

Additionally, in order to prevent the DC offset due to the self heating of the transistors, the mixer section is in advance operated before reaching a receiving period, and can be also switched to the receiving mode at the time when the thermal interference between the transistors reaches its saturation. However, there are problems such that its useless current consumption is increased in this case and the awaiting time of the cellular phone etc. is shortened.

An object of the present invention is to provide a semiconductor integrated circuit device capable of largely improving the receiving sensitivity to the signals by reducing the thermal interference due to the self heating of each transistor constituting the gilbert cell circuit.

The above and other objects and novel characteristics of the present invention will be apparent from the description of this specification and the accompanying drawings.

The typical ones of the inventions disclosed in this application will be briefly described as follows.

1. The present invention is a semiconductor integrated circuit device, which comprises a mixer section composed of a gilbert cell circuit demodulating a received signal and converting it into a voice-band signal, wherein each of transistors constituting the gilbert cell circuit has a configuration in which a first and second transistor sections each composed of one or more transistors for multiple layout are connected in parallel, and, in a layout on a semiconductor chip, at least the transistors on an upper stage in the gilbert cell circuit are such that the first transistor section and the second transistor section are arranged in a crisscross shape.

Also, the outline of another invention in this application will be briefly described.

2. The present invention is a semiconductor integrated circuit device, which comprises: a mixer section demodulating a received signal and converting it into a voice band signal; an amplifier section amplifying the signal outputted from the mixer section and outputting it; and a phase divider section generating an orthogonal signal and outputting it to the mixer section, wherein the amplifier section has a configuration in which a plurality of variable amplifiers provided with two or more amplifier circuits each having different gain and an amplifier whose gain is fixed on a last stage are connected to each other, and, in a layout on a semiconductor chip, a phase divider section is arranged between the mixer section and the amplifier section, and the amplifier circuits provided in the first-stage variable amplifiers are arranged so that their gains become small as they are close to said phase divider section.

DESCRIPTION OF THE PREFERRED EMBODIMENTS

Hereinafter, embodiments of the present invention will be described in detail based on the drawings.

Figure 1:
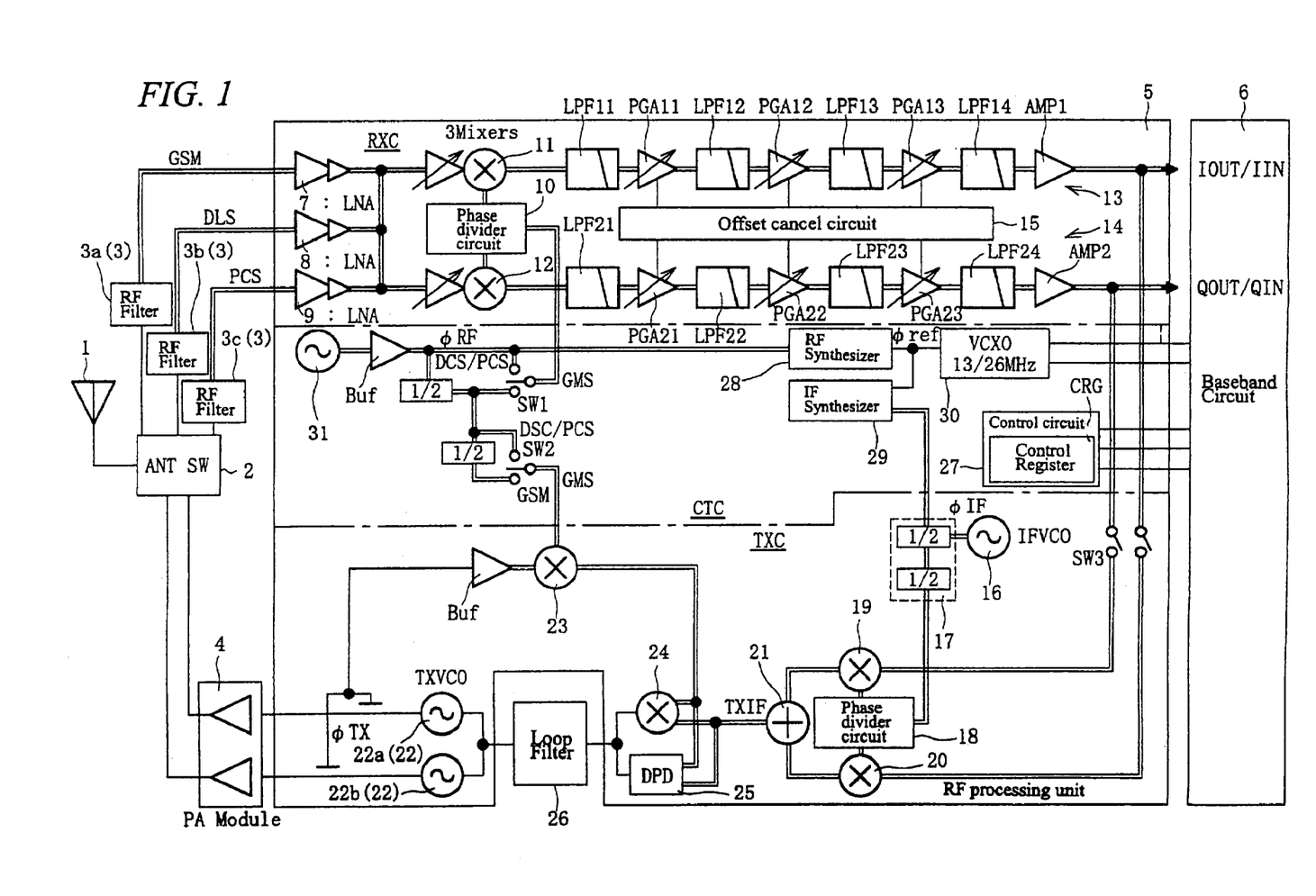
FIG. 1 is a block diagram of a mobile communication system according to an embodiment of the present invention.
Figure 2:
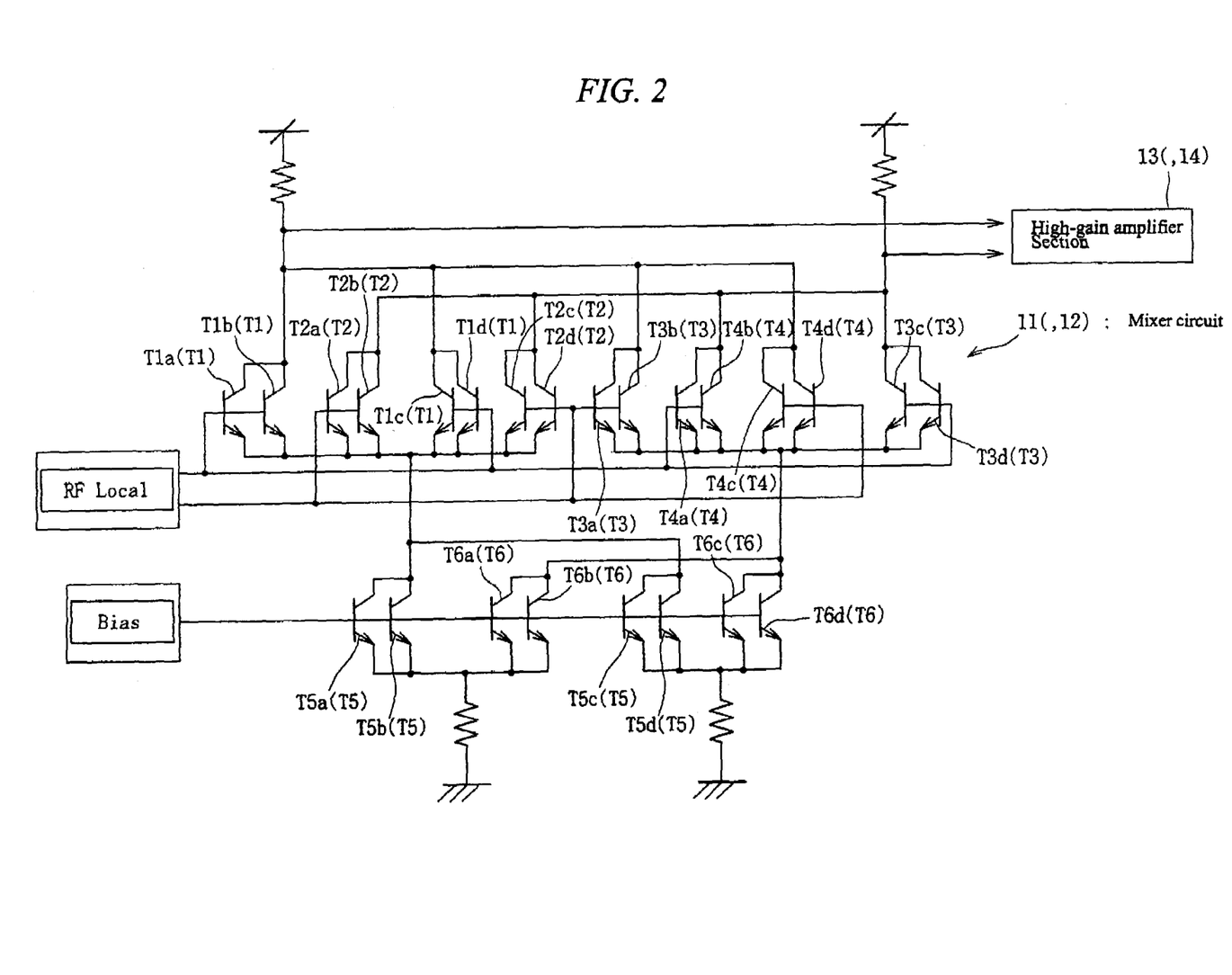
FIG. 2 is an equivalent circuit diagram of a mixer section provided in the mobile communication system in FIG. 1.
Figure 3:
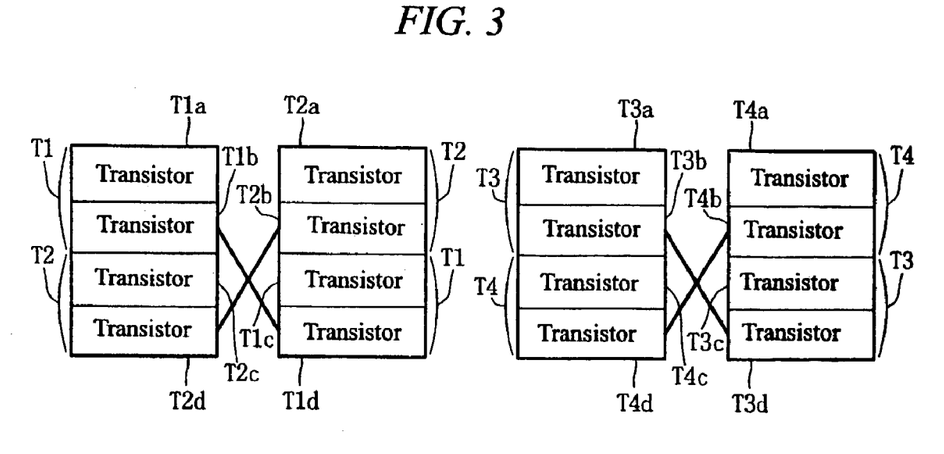
FIG. 3 is an image layout diagram of upper-stage transistors, each of which constitutes a gilbert cell circuit in the mixer section in FIG. 2.
Figure 4:
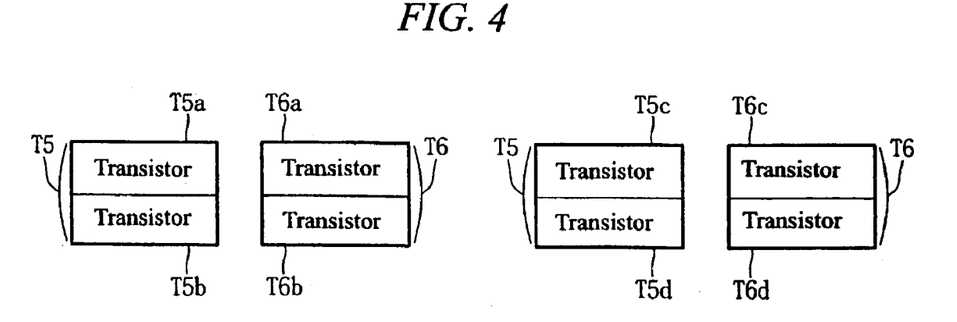
FIG. 4 is an image layout diagram of lower-stage transistors, each of which constitutes a gilbert cell circuit in the mixer section in FIG. 2.
Figure 5:
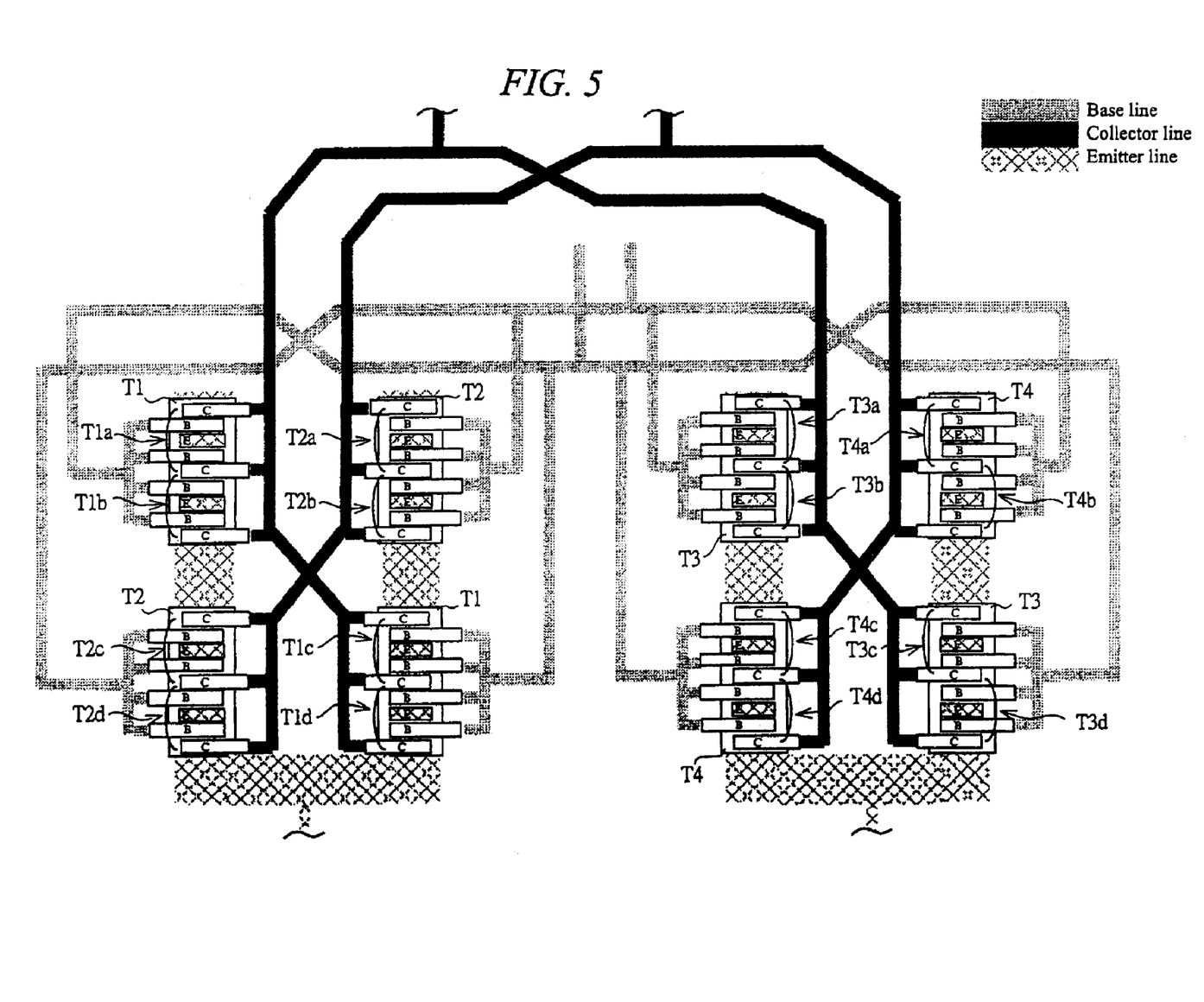
FIG. 5 is a chip layout diagram of the upper-stage transistors, each of which constitutes the gilbert cell circuit in FIG. 3.
Figure 6:
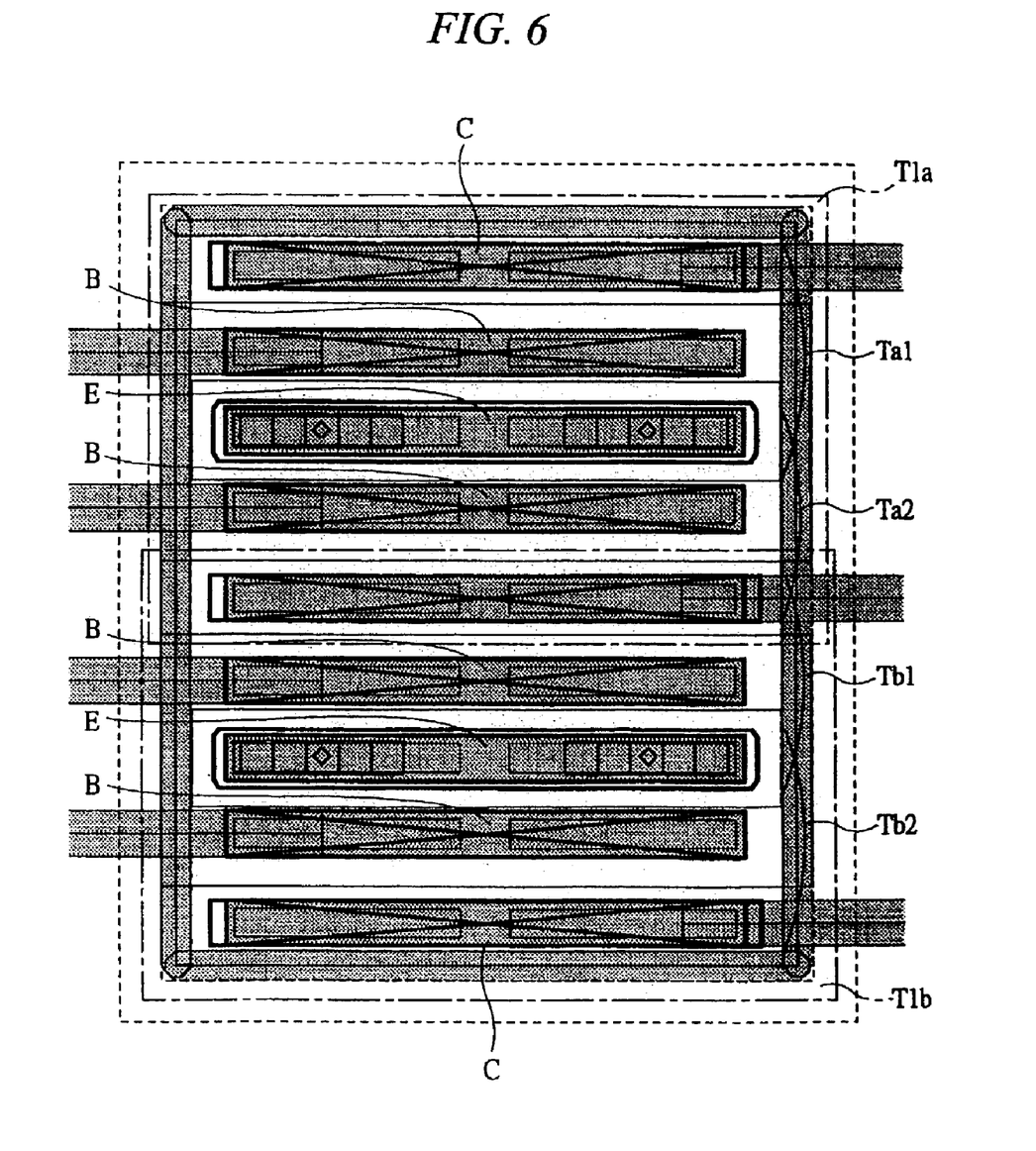
FIG. 6 is a chip layout diagram showing an example of the transistors multiple-laid out in FIG. 3.
Figure 7:
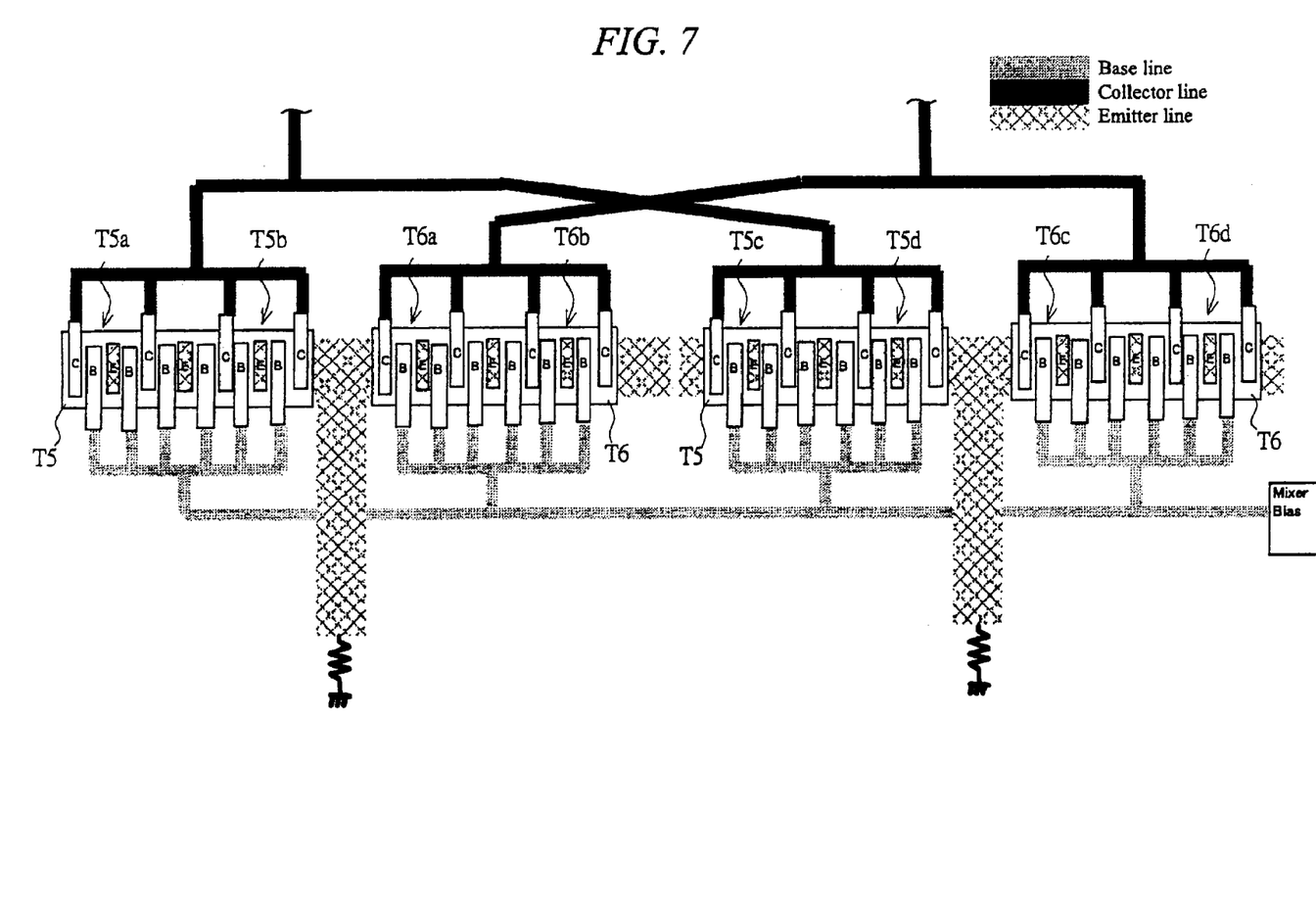
FIG. 7 is a layout diagram of a semiconductor chip on which the transistors in FIG. 4 are provided.
Figure 8:
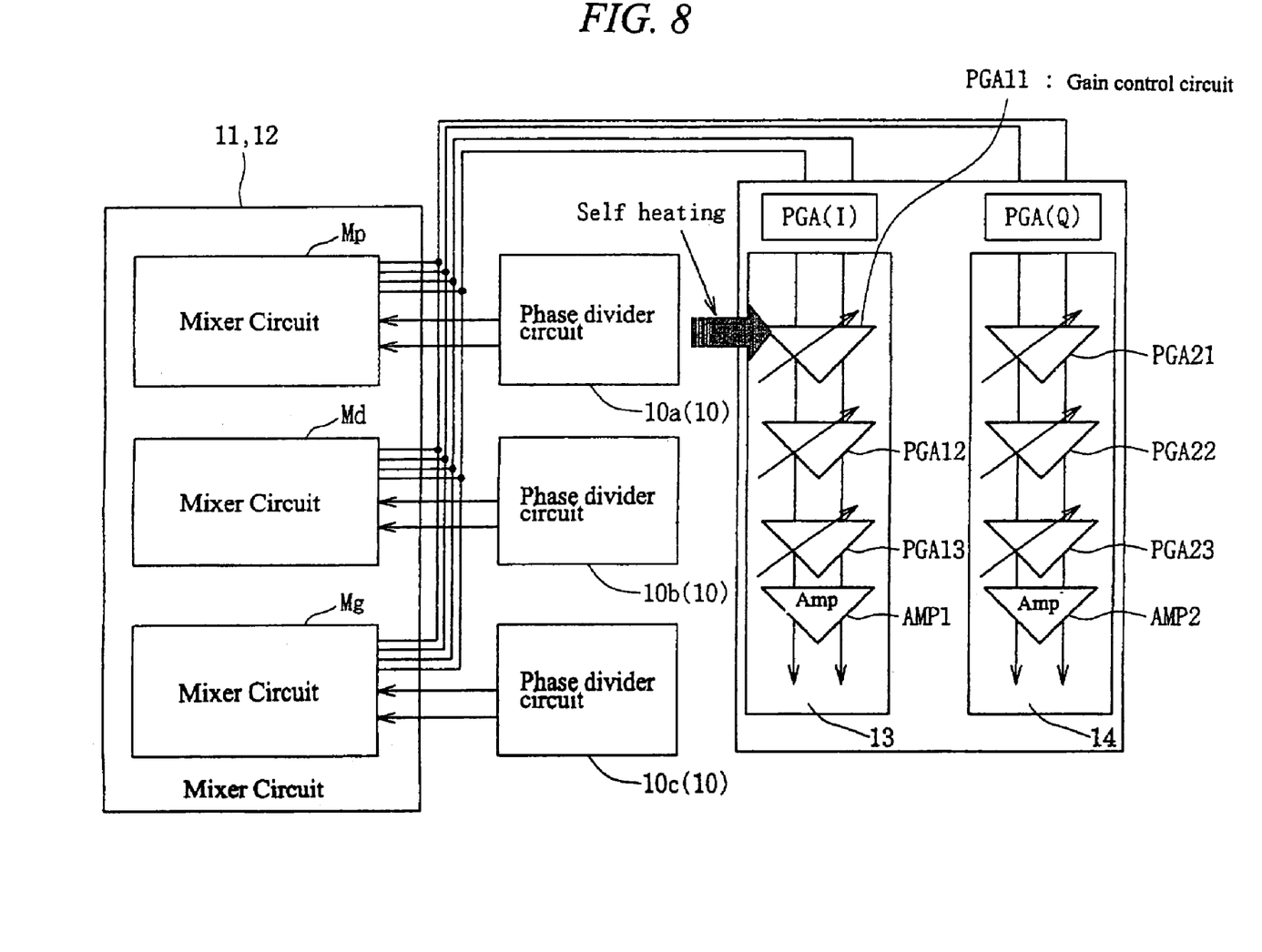
FIG. 8 is an explanatory diagram showing a layout image of mixer circuits, phase divider circuits, high-gain amplifier sections on a semiconductor chip, which are provided in the mobile communication system in FIG. 1.
Figure 9:
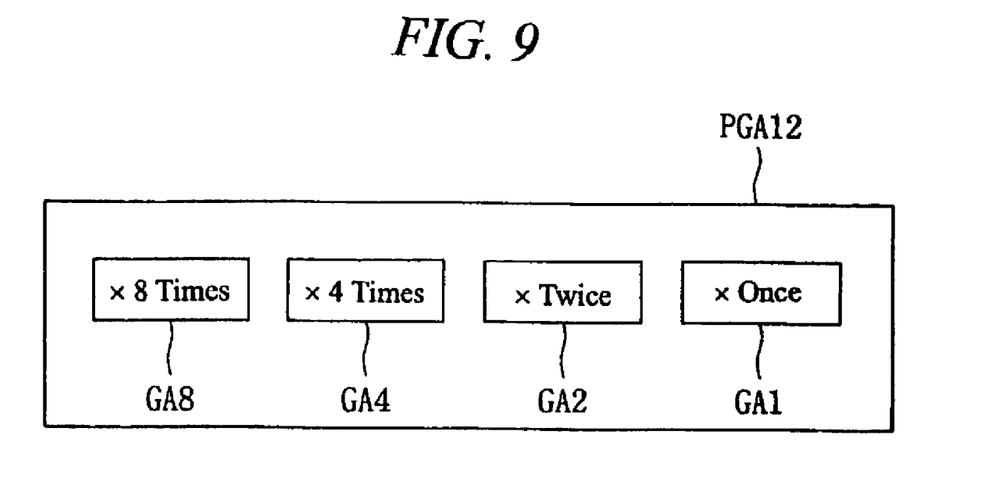
FIG. 9 is a layout image diagram showing a gain control amplifier provided in the high-gain amplifier section in FIG. 8.
Figure 10:
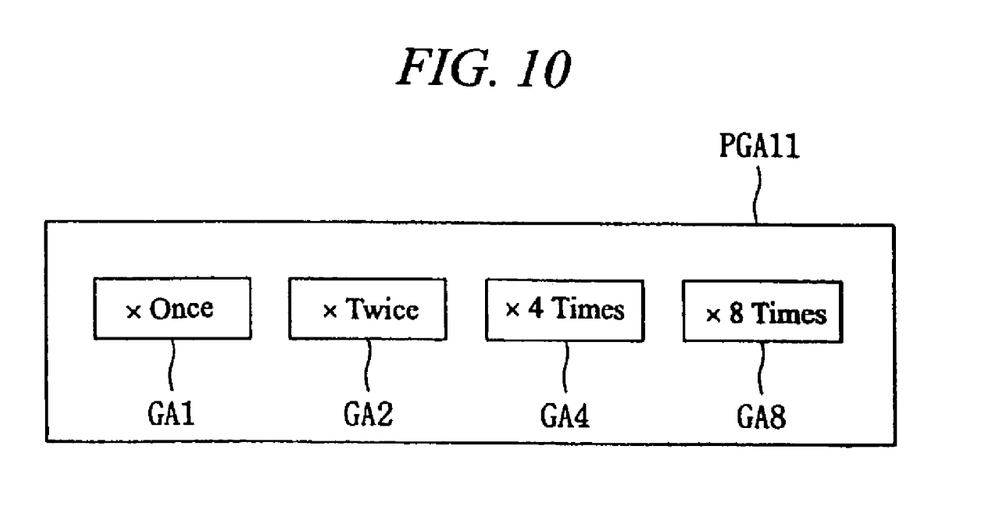
FIG. 10 is a layout Image diagram showing another example of a gain control amplifier provided in the high-gain amplifier section in FIG. 8.
Figure 11:
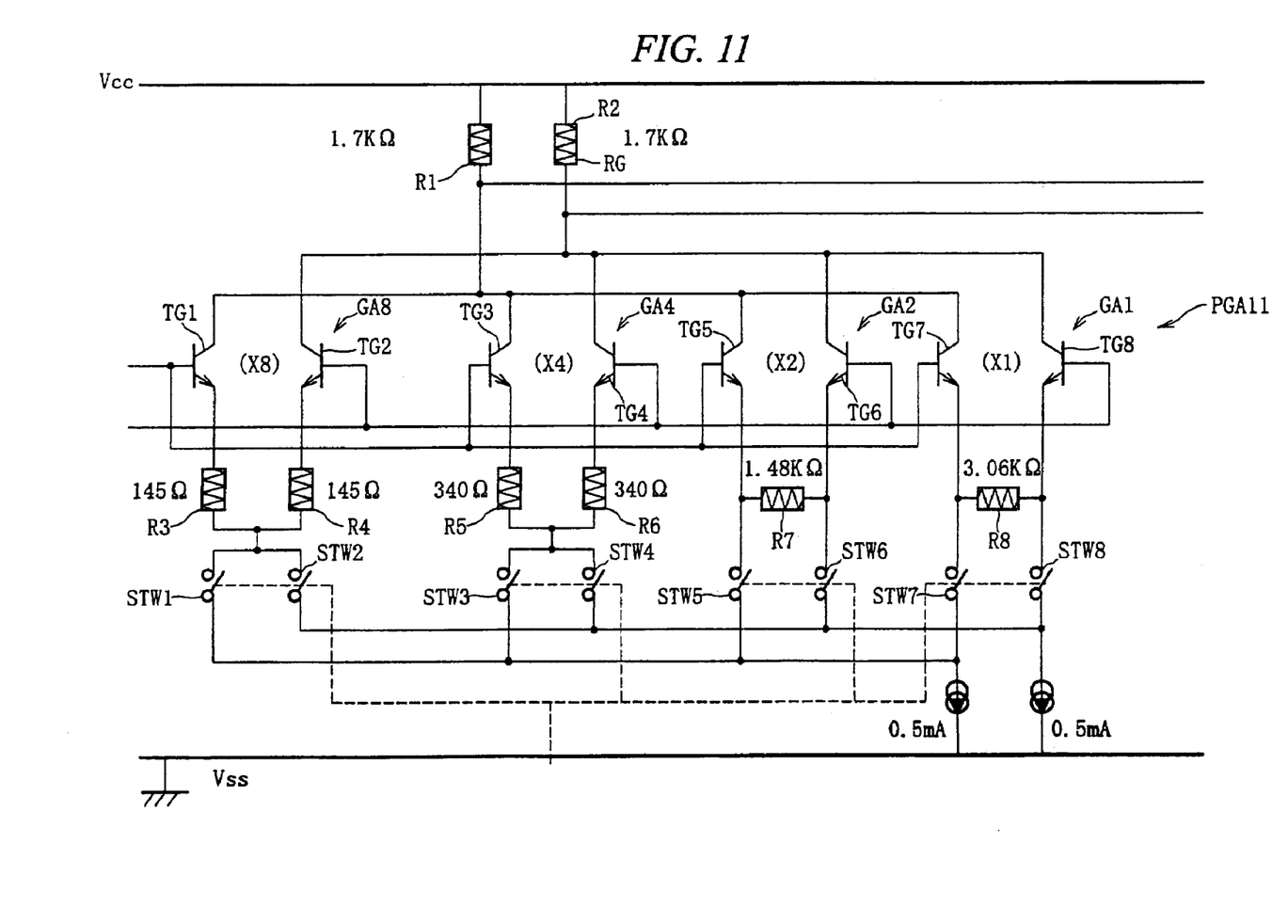
FIG. 11 is an equivalent circuit diagram of the high-gain amplifier section in FIG. 8.

FIG. 1 is a block diagram of a mobile communication system according to an embodiment of the present invention; FIG. 2 is an equivalent circuit diagram of a mixer section provided in the mobile communication system in FIG. 1; FIG. 3 is an image layout diagram of upper-stage transistors, each of which constitutes a gilbert bell circuit in the mixer section in FIG. 2; FIG. 4 is an image layout diagram of lower-stage transistors, each of which constitutes a gilbert cell circuit in the mixer section in FIG. 2; FIG. 5 is a chip layout diagram of the upper-stage transistors, each of which constitutes the gilbert cell circuit in FIG. 3; FIG. 6 is a chip layout diagram showing an example of the transistors multiple-laid out in FIG. 3; FIG. 7 is a layout diagram of a semiconductor chip on which the transistors in FIG. 4 are provided; FIG. 8 is an explanatory diagram showing a layout image of mixer circuits, phase divider circuits, high-gain amplifier sections provided on a semiconductor chip on a semiconductor chip, which are provided in the mobile communication system in FIG. 1; FIG. 9 is a layout image diagram showing a gain control amplifier provided in the high-gain amplifier section in FIG. 8; FIG. 10 is a layout image diagram showing another example of a gain control amplifier provided in the high-gain amplifier section in FIG. 8; and FIG. 11 is an equivalent circuit diagram of the high-gain amplifier section in FIG. 8.

A mobile communication system in this embodiment is, for example, a communication system such as a cellular phone etc. As shown in FIG. 1, this mobile communication system comprises a transmitting/receiving antenna 1, an antenna switch 2, RF filters 3, an RF power amplifier circuit 4, an RF processing unit (semiconductor integrated circuit device) 5, and a baseband circuit (LSI) 6, etc.

The antenna 1 transmits and receives signal waves. The antenna switch 2 switches the transmitting signals and the received signals. Each RF filter 3 is composed of an SAW filter etc. for removing the unnecessary waves from the received signals.

The RF power amplifier circuit 4 amplifies the transmitting signals. The RF processing unit 5 demodulates the received signals and modulates the transmitting signals. This RF processing unit 5 is formed as a semiconductor integrated circuit device on a semiconductor chip. The baseband circuit 6 converts transmitting data into I signals and Q signals and controls the RF processing unit 5.

Though not particularly limited, the RF processing unit 5 is designed to have a structure, which makes it possible to modulate/demodulate the signals based on four communication systems, GSM850, GSM900, DCS1800, and PCS1900.

Accordingly, the RF filters 3 are provided with a filter 3a through which the received signals with a frequency band for the GSM series pass, a filter 3b through which the received signals with a frequency band for the DCS1800 pass, and a filter 3c through which the received signals with a frequency band for the PCS 1900 pass. The GSM850 and GSM950 are filtered by the common filter 3a in this case since their frequency bands are close to each other.

Also, when being roughly divided, the RF processing unit 5 includes: a receiving system circuit RXC; a transmitting system circuit TXC; and a controlling system circuit CTC composed of a circuit commonly used in a transmitting/receiving system circuit such as a control circuit and a clock circuit, etc. except the above-mentioned circuits.

The receiving system circuit RXC is composed of low-noise amplifiers 7 to 9, a phase divider circuit (phase divider section) 10, mixer circuits (mixer sections) 11 and 12, high-gain amplifier sections (amplifier sections) 13 and 14, an offset cancel circuit 15 and the like.

The low-noise amplifiers 7 to 9 are amplifiers for amplifying the received signals. The phase divider circuit 10 divides oscillator signals φRF generated in a later-described RF oscillator circuit (RFVCO) 31, and generates orthogonal signals whose phases are shifted 90 degrees with respect to each other.

The mixer circuits 11 and 12 are demodulator circuits, each of which performs the demodulation by combining the orthogonal signals divided in the divider circuit 10 and the received signals amplified in the low-noise amplifiers 7 to 9. The high-gain amplifier sections 13 and 14 respectively amplify the demodulated I and Q signals to output them to the baseband circuit 6. The offset cancel circuit 15 cancels an input DC offset of each amplifier in the high-gain amplifier sections 13 and 14.

The high-gain amplifier section 13 has a structure in which: a plurality of low-path filters LPF11, LPF12, LPF13, and LPF14 and gain control amplifiers (variable amplifiers) PGA11, PGA12, and PGA13 are alternately connected in series; and an amplifier AMP1 having a fixed gain is connected at the last stage, and it amplifies the I signals to output them to the baseband circuit 6.

Similarly, the high-gain amplifier section 14 also has a structure in which: a plurality of low-path filters LPF21, LPF22, LPF23, and LPF24 and gain control amplifiers (variable amplifier) PGA21, PGA22, and PGA23 are alternately connected in series; and an amplifier AMP2 having a fixed gain is connected at the last stage, and it amplifies the Q signals to output them to the baseband circuit 6.

The offset cancel circuit 15 comprises; A/D (analog/digital) converter circuits provided so as to correspond to the respective gain control amplifiers PGA11 to PGA23, and converting, into digital signals, the output potential difference therebetween in a state of being short-circuited between the input terminals thereof; D/A (digital/analog) converter circuits for generating input offset voltages such that the DC offset in each output of the corresponding gain control amplifiers PGA11 to PGA23 has a value of "0" based on the conversion results obtained from the A/D converter circuits, and for applying them to the differential input; a control circuit for controlling the A/D converter circuits and the D/A converter circuits to perform an offset cancel operation; and the like.

The transmitting system circuit TXC comprises an oscillator circuit (IFVCO) 16, a divider circuit 17, a phase divider circuit 18, modulator circuits 19 and 20, an adder 21, an oscillator circuit for transmission (TXVCO) 22, an offset mixer 23, an analog phase comparator 24, a digital phase comparator 25, and a loop filter 26, etc.

The oscillator circuit (IFVCO) 16 generates oscillator signals φIF with an intermediate frequency of, for example, about 640 MHz. The divider circuit 17 is used for the ¼ division of the oscillator signals φIF generated in the oscillator circuit 16 to generate the signals with a frequency of about 160 MHz.

The phase divider circuit 18 further divides the signals divided in the divider circuit 17, and generates the orthogonal signals whose phases are shifted 90 degrees with respect to each other. The modulator circuits 19 and 20 modulate the generated orthogonal signals by using the I and Q signals supplied from the baseband circuit 6.

The adder 21 combines the modulated signals. The oscillator circuit for transmission (TXVCO) 22 generates transmitting signals φTX with a predetermined frequency. The offset mixer 23 combines feedback signals, which are obtained by the extraction of the transmitting signals φTX outputted from the oscillator circuit for transmission (TXVCO) 22 by the coupler etc., and signals φRF', which are obtained by dividing oscillator signals φRF generated in the RF oscillator circuit 31, thereby generating signals with a frequency equivalent to the frequency difference therebetween.

The analog phase comparator 24 and the digital phase comparator 25 compare the output of the offset mixer 23 and signals TXIF combined in the adder 21, thereby detecting the phase difference therebetween. The loop filter 26 generates a voltage depending upon the outputs of the phase detection circuits 24 and 25.

Note that resistors and capacitors, which constitute the loop filter 26, are connected as external elements to external terminals of the RF processing unit 5. The oscillator circuit for transmission 22 consists of an oscillator circuit 22a generating respective transmitting signals for the GSM850 and GSM900, and an oscillator circuit 22b generating respective transmitting signals for the DCS1800 and PCS1900.

The reason why two oscillator circuits are provided is that the oscillator circuit for transmission has a wider variable frequency range in comparison to the RF oscillator circuit 31 and the intermediate-frequency oscillator circuit 16 and thus it is not easy to design a circuit capable of covering the entire frequency range with one oscillator circuit.

The reason why the analog phase comparator 24 and the digital phase comparator 25 are provided is that it is necessary to achieve a fast lead-in operation when the PLL circuit starts operating. More concretely, at the start of the transmission, the phase comparison is first performed by the digital phase comparator 25, and thereafter the digital phase comparator 25 is switched to the analog phase comparator 24, whereby the phase loop can be locked at high speed.

Also, a control circuit 27, an RF synthesizer 28, an IF synthesizer 29, and a reference oscillator circuit (VCXO) 30 are mounted on a chip of the RF processing unit 5.

The control circuit 27 performs the overall control of the chip. The RF synthesizer 28 constitutes an RF PLL circuit together with the RF oscillator circuit 31. The IF synthesizer 29 constitutes an IF PLL circuit together with the intermediate-frequency oscillator circuit 16. The reference oscillator circuit 30 generates clock signals φref to be reference signals for the RF synthesizer 28 and the IF synthesizer 29.

The RF synthesizer 28 and the IF synthesizer 29 are each composed of a phase comparator circuit, a charge pump, and a loop filter, etc. Note that since high frequency accuracy is required in the reference oscillator signals φref, an external crystal resonator is connected to the reference oscillator circuit 30. Signals each having a frequency of 26 MHz or 13 MHz are selected as the reference oscillator signals φref. This is because the crystal resonator for such frequencies can be obtained at relatively low cost.

In FIG. 1, blocks denoted by fraction numbers such as ½ and ¼ respectively represent divider circuits, and those denoted by the reference symbol "Buf" represent buffer circuits. Also, SW1 and SW2 denote switches for switching the connection states between a GSM mode performing the transmission/reception in accordance with the GSM method and a DCS/PCS mode performing the transmission/reception in accordance with the DCS or PCS method, and for selecting the dividing ratio of signals to be transmitted.

SW3 denotes a switch, which is turn-on and turn-off controlled for supplying, to the modulation mixers 19 and 20, the I and Q signals from the baseband circuit 6 at the time of the transmission. These switches SW1 to SW3 are controlled based on the signals from the control circuit 27.

A control register CRG is provided in the control circuit 27, and the setting of the register CRG is made on the basis of the signals from the baseband circuit 6. More concretely, clock signals CLK for synchronization, data signals SDATA, and load enable signals LEN as control signals are supplied to the RF processing unit 5 from the baseband circuit 6. When the load enable signals LEN are asserted to effective levels, the control circuit 27 sequentially takes in the data signals SDATA transmitted from the baseband circuit 6 in synchronization with the clock signals CLK to set them into the above-mentioned control register CRG. Though not particularly limited, the data signals SDATA are transmitted in serial form. The baseband circuit 6 is composed of a microprocessor and the like.

Though not particularly limited, the control register CRG is provided with: a control bit to start the frequency measurement of the VCO in the RF oscillator circuit (RFVCO) 31 and the intermediate-frequency oscillator circuit 16; a bit field for designating modes such as the receiving mode, the transmitting mode, the idling mode, and the warm-up mode, etc.; and the like.

In this case, the idling mode indicates: a mode of coming to a sleeping state such that only a few circuits are operated and most of the circuits, which include at least the oscillator circuit, are stopped, similarly to the awaiting time or the like; and a mode such that the warm-up mode makes the PLL circuit activated just before the transmission or reception.

In this embodiment, the phase detection circuits 24 and 25, the loop filter 26, the oscillator circuits for transmission 22a and 22b, and the offset mixer 23 constitute the PLL circuit for transmission (TXPLL), which performs the frequency conversion.

In a wireless communication system employing the multi-band method according to this embodiment, the control circuit 27 changes the frequency φRF of the oscillator signals of the RF oscillator circuit 31 depending upon the channels to be used at a time of the transmitting/receiving, for example, in accordance with the commands from the baseband circuit 6, and the switch SW2 is switched depending on the GSM mode or DCS/PCS mode to change the frequency of signals supplied to the offset mixer 23, whereby the transmission frequency is switched.

Even in any cases of GSM, DCS, and PSC, the oscillation frequency of the intermediate-frequency oscillator circuit 16 is set at 640 MHz, and this frequency is divided into one-eighth by the divider circuit 17 and the phase divider circuit 18, and then the 80 MHz carrier wave (TXIF) is generated to perform the modulation.

Meanwhile, the oscillation frequency of the RF oscillator circuit 31 is set at different values depending on the receiving mode and the transmitting mode. The oscillation frequency fRF of the RF oscillator circuit 31 in the receiving mode is set to, for example, 3616 to 3716 MHz in the case of the GSM850, 3840 to 3980 MHz in the case of the GSM900, 3610 to 3730 MHz in the case of the DCS, or 3860 to 3980 MHz in the case of the PCS. The frequency is divided into one-fourth by the divider circuit in the case of the GSM or into one-second in the cases of the DCS and PCS, and supplied to the offset mixer 23 as φRF'.

The offset mixer 23 outputs signals equivalent to the difference (fRX'–fTX) in frequency between the φRF' and the oscillator signals φTX for transmission from the oscillator circuit for transmission 4, and the PLL (TXPLL) for transmission is operated so that the frequency of the difference signals is matched with that of the modulation signal TXIF.

In other words, the oscillator circuit for transmission 22 is controlled to oscillate with a frequency equivalent to the difference between the frequency (fRF/4) of the oscillator signals φRF' from the RF oscillation circuit 31 and the frequency (fTX) of the modulation signals TXIF. This is a transmission operation in the system generally called the offset PLL method.

Also, the circuit configuration of the mixer circuit 11 (, 12) in the RF processing unit 5 will be described.

FIG. 2 is an equivalent circuit diagram of the mixer circuit 11 (, 12). The mixer circuit 11 (, 12) is composed of transistors T1 to T6, and these transistors T1 to T6 constitute a gilbert cell circuit. In this gilbert cell circuit, the upper stage thereof is composed of the transistors T1 to T4 and the lower stage thereof is composed of the transistors T5 and T6.

Collectors of the transistors T1 and T3 and those of the transistors T2 and T4 function as the output sections of the mixer circuit 11 (, 12) and are DC-connected (directly coupled) to the high-gain amplifier section 13 (, 14) on the latter stage.

The transistors T1 to T6 are also composed of four transistors, respectively. For example, the transistor T1 is composed of transistors T1a to T1d connected in parallel.

Similarly, the transistors T2 to T6 are respectively composed of transistors T2a to T2d, T3a to T3d, T4a to T4d, T5a to T5d, and T6a to T6d connected in parallel.

FIG. 3 is a layout image diagram in which the transistors T1a to T1d, T2a to T2d, T3a to T3d, and T4a to T4d, which constitute the gilbert cell circuit, are laid out on a semiconductor chip.

Also, FIG. 4 is a layout image diagram in which the transistors T5a to T5d and T6a to T6d, which constitute the gilbert cell circuit, are laid out on the semiconductor chip.

As shown, transistors which constitute the transistor T1 and T2, those which constitute the transistors T3 and T4, and those which constitute the transistors T5 and T6 are each laid out in a crisscross shape.

For example, in the case of the transistors T1 and T2, the transistors T1a to T1d and the transistors T2a to T2d are respectively separated into two pairs, and the respective two pairs are laid out in crisscross shape so that they are crossed with each other.

Similarly, in the case of the transistors T3 and T4 and the transistors T5 and T6, the transistors T3a to T3d and T4a to T4d and the transistors T5a to T5d and T6a to T6d are respectively separated into two pairs, and the respective two pairs are laid out in a crisscross shape so that they are crossed with each other.

Thus, the transistors T1 to T4 are equally separated and respectively laid out in a crisscross shape. By so doing, it is possible to uniform the thermal influence on the transistors T1 to T4.

FIG. 5 is a diagram showing an example of a layout of the transistors T1 to T4 arranged on a semiconductor chip.

In FIG. 5, the transistors T1a and T1b (first transistor section, transistor for multiple layout) of the transistor T1 are arranged in a multiple layout on the upper left, and the transistors T2c and T2d (second transistor section, transistor for multiple layout) of the transistor T2 are arranged in a multiple layout below them.

On the right side of the transistors T1a and T1b, the transistors T2a and T2b (first transistor section, transistor for multiple layout) of the transistor T2 are arranged in a multiple layout, and the transistors T1c and T1d (second transistor section, transistor for multiple layout) of the transistor T1 are arranged in a multiple layout below them.

Also, on the upper right, the transistors T3a and T3b (first transistor section, transistor for multiple layout) of the transistor T3 are arranged in a multiple layout, and the transistors T4c and T4d (second transistor section, transistor for multiple layout) of the transistor T4 are arranged in a multiple layout below them.

Further, on the right side of the transistors T3a and T3b, the transistors T4a and T4b (first transistor section, transistor for multiple layout) of the transistor T4 are arranged in a multiple layout, and the transistors T3c and T3d (second transistor section, transistor for multiple layout) of the transistor T3 are arranged in a multiple layout below them.

FIG. 6 is a layout diagram showing an example of the transistors T1a and T1b arranged in a multiple layout on a semiconductor chip.

The transistor T1a is composed of two transistors Ta1 and Ta2 and the transistor T1b is also composed of two transistors Tb1 and Tb2.

The transistors Ta1 and Ta2 and the transistors Tb1 and Tb2 are arranged in a multiple layout in which the emitters E, the collectors C, and the bases B thereof are commonly connected, respectively.

Also, even if being composed of, for example, odd-number transistors, the transistors T1 to T4 may be separated and respectively laid out in a crisscross shape.

Figure 12:
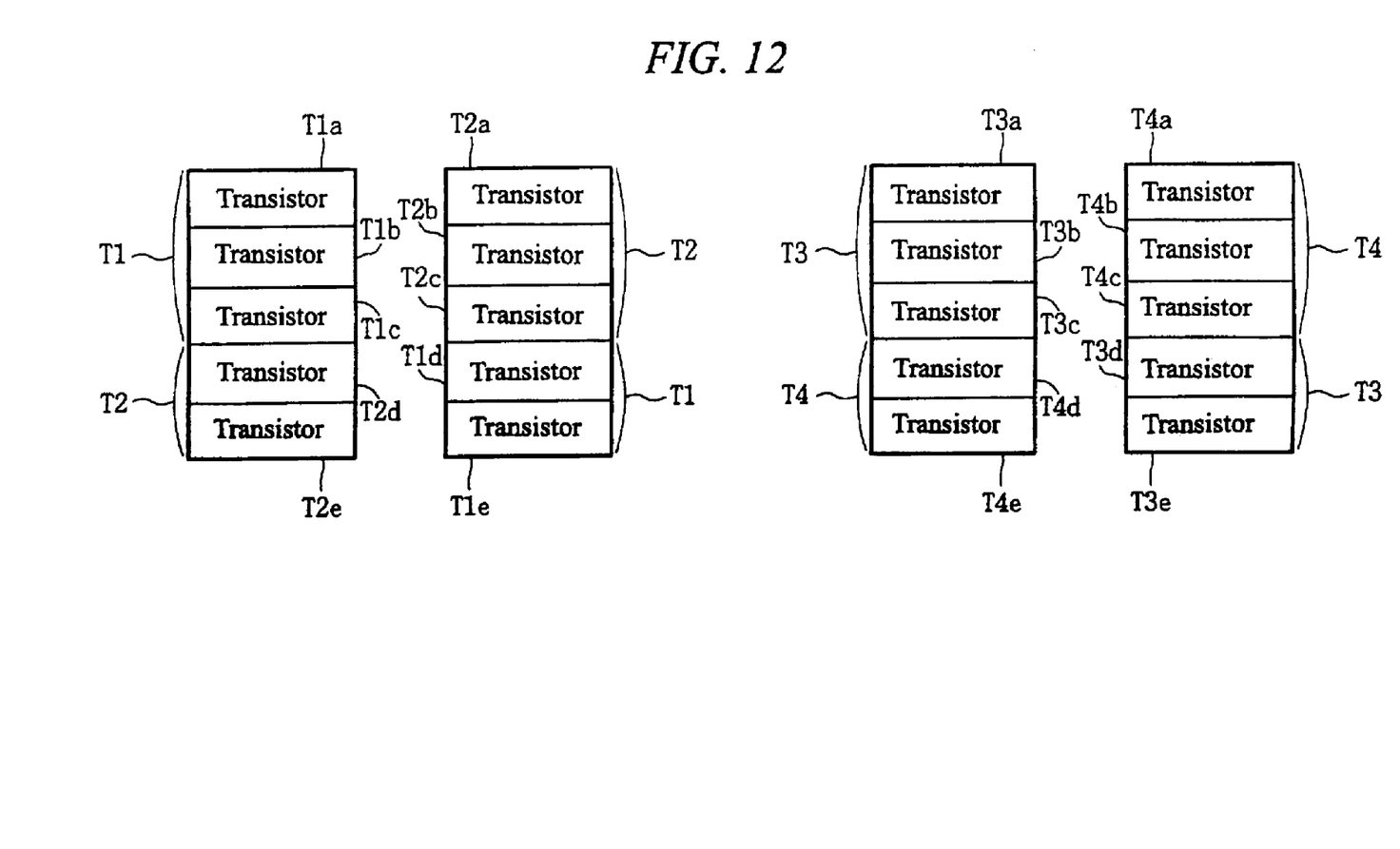
FIG. 12 is an image layout diagram of upper-stage transistors, each of which constitutes the gilbert cell circuit in a mixer section according to another embodiment of the present invention.

Further, when the transistors T1 to T4 are composed of, for example, odd-number transistors, the transistors T1 to T4 may be separated in a ratio of 3:2 and respectively laid out in a crisscross shape as shown in FIG. 12.

For example, as shown in FIG. 12, if the transistors T1 to T4 are respectively composed of five transistors such as transistors T1a to T1e, T2a to T2e, T3a to T3e and T4a to T4e, then the transistors T1a to T1e and T2a to T2e and the transistors T3a to T3e and T4a to T4e may be respectively separated in a ratio of 3:2 and laid out in a crisscross shape.

Also in this case, the thermal influence on the respective transistors T1 to T4 can be reduced. However, in the case of achieving more uniform thermal influence thereon, it is more preferable to equally separate the transistors T1 to T4 and to respectively lay out them in a crisscross shape.

Also, FIG. 7 is a diagram showing an example of the layout of the transistors T5 and T6 on a semiconductor chip.

On the left side in FIG. 7, the transistors T5a and T5b (first transistor section, transistor for multiple layout) of the transistor T5 are arranged in a multiple layout, and the transistors T6a and T6b (first transistor section, transistor for multiple layout) of the transistor T6 are arranged in a multiple layout on the upper right thereof.

Also, on the upper right of the transistors T6a and T6b, the transistors T5c and T5d (second transistor section, transistor for multiple layout) of the transistor T5 are arranged in a multiple layout, and the transistors T6c and T6d (second transistor section, transistor for multiple layout) of the transistor T6 are arranged in a multiple layout on the upper right thereof.

Thus, the transistors T1 to T6 are respectively laid out in a crisscross shape. By so doing, it is possible to uniform the thermal interference due to the self heating of the respective transistors T1 to T6, and to largely reduce each DC offset of the mixer circuits 11 and 12, which constitute the gilbert cell circuit.

Consequently, since the operation of the mixer circuits 11 and 12 in advance before the receiving mode becomes unnecessary, the current consumption of the RF processing unit 5 can be reduced, thereby allowing for lengthening the awaiting time of the mobile communication system.

FIG. 8 is an explanatory diagram showing a layout image of the mixer circuits 11 and 12, the phase divider circuit 10, the high-gain amplifiers 13 and 14 in the receiving system circuit RXC, which are provided on a semiconductor chip. Note that the illustration of the layout of the low-path filters LPF11 to LPF14 and LPF21 to LPF24 is omitted in this drawing.

The mixer circuits 11 and 12 are each composed of mixer circuits Mp, Md and Mg. The mixer circuits Mp, Md and Mg are each laid out below from above on the left side of FIG. 8.

The mixer circuit Mp is a mixer operated in receiving the signals with a frequency band for the PCS1900. The mixer circuit Md is a mixer operated in receiving the signals with a frequency band for the DCS1800. The mixer circuit Mg is a mixer operated in receiving the signals with a frequency band for the GSM series.

Also, on each right side of the mixer circuits 11 and 12, the phase divider circuit 10 is provided. The phase divider circuit 10 is composed of phase divider circuits 10a to 10c laid out below from above.

The phase divider circuit 10a is operated in receiving the signals with a frequency band for the PCS1900. The phase divider circuit 10b is operated in receiving the signals with a frequency band for the DCS1800. The phase divider circuit 10c is operated in receiving the signals with a frequency band for the GSM series.

Also, the high-gain amplifier 13 is arranged on the right side of the phase divider circuit 10. The high-gain amplifier 14 is arranged on the right side of the high-gain amplifier 13. These high-gain amplifiers 13 and 14 are DC-connected (directly coupled) to the mixer circuits 11 and 12, respectively, as described above.

The high-gain amplifier 13 is composed of gain control amplifiers PGA11 to PGA13 and an amplifier AMP1 laid out below from above. Similarly, the high-gain amplifier 14 is composed of gain control amplifiers PGA21 to PGA23 and an amplifier AMP2 laid out below from above.

The gain control amplifiers PGA11 to PGA13 and PGA21 to PGA23 have each structure in which the gain is switched to a single (×1), double (×2), fourfold (×4) and eightfold (×8) ones.

FIG. 9 is a layout image diagram of amplifiers GA8, GA4, GA2 and GA1 provided in the gain control amplifier PGA12 (PGA13, PGA21 to PGA23), and FIG. 10 is a layout image diagram of amplifiers GA8, GA4, GA2 and GA1 provided in the gain control amplifier PGA11.

As shown in FIG. 9, the amplifier GA8 with a eightfold gain, the amplifier GA4 with a fourfold gain, the amplifier GA2 with a double gain, and the amplifier GA1 with a single gain are laid out in the gain control amplifiers PGA12, PGA13, and PGA21 to PGA23 from left side to right.

Meanwhile, as shown in FIG. 10, the amplifier GA1 with a single gain, the amplifier GA2 with a double gain, the amplifier GA4 with a fourfold gain, and the amplifier GA8 with a eightfold gain are laid out in the gain control amplifier PGA11 from right side to left, that is, in the reverse order of the case of the gain control amplifiers PGA12, PGA13, and PGA21 to PGA23.

FIG. 11 is an equivalent circuit diagram of the gain control amplifier PGA11 (PGA12, PGA13, and PGA21 to PGA23).

The amplifiers GA8, GA4, GA2 and GA1 comprise differential amplifier circuits, each of which is composed of the transistors TG1 and TG2, TG3 and TG4, TG5 and TG6, and TG7 and TG8, respectively.

A power supply voltage VCC is connected via a resistor R1 to the collectors of the transistors TG1, TG3, TG5 and TG7. The power supply voltage VCC is connected via a resistor R2 to the collectors of the transistors TG2, TG4, TG6 and TG8.

The collectors of the transistors TG1, TG3, TG5 and TG7 and the collectors of the transistors TG2, TG4, TG6 and TG8 serve as the output sections of the gain control amplifiers.

Also, the bases of transistors TG1, TG3, TG5 and TG7 and the bases of the transistors TG2, TG4, TG6 and TG8 are connected, respectively, so that signals from the mixer circuits 11 and 12 are inputted.

One connecting portion of each of the resistors R3 to R6 is connected to each emitter of the transistors TG1 to TG4. One connecting portion of each of the switches STW1 and STW2 is connected to the other connecting portion of each of the resistors R3 and R4, and one connecting portion of each of the switches STW3 and STW4 is connected to the other connecting portion of each of the resistors R5 and R6.

One connecting portion of each of the switches STW5 and STW6 is connected to each emitter of the transistors TG5 and TG6. The resistor R7 is connected in parallel between the emitters of the transistors TG5 and TG6.

One connecting portion of each of the switches STW7 and STW8 is connected to each emitter of the transistors TG7 and TG8. The resistor R8 is connected in parallel between the emitters of the transistors TG7 and TG8.

The other connecting portions of the switches STW1, STW3, STW5 and STW7 and those of the switches STW2, STW4, STW6 and STW8 are commonly connected to the reference potential VSS.

Respective control terminals of the switches STW1 to STW8 are connected so that control signals are inputted to them, whereby the switches STW1 to STW8 are ON/OFF-controlled based on the control signals. When the control signals are inputted, any one set of the switches STW1 and STW2, STW3 and STW4, STW5 and STW6, and STW 7 and STW8 is turned ON.

Thus, the gain control amplifier changes the gains in the amplifiers GA8, GA4, GA2 and GA1 by controlling the resistance values of the resistors R3 to R8. In the configuration shown in FIG. 11, the gain control amplifiers GA8, GA4, GA2 and GA1 are set such that the resistance values of R3 and R4 are about 145 Ω, those of R5 and R6 are about 340 Ω, that of R7 is 1.48 KΩ, and that of R8 is about 3.06 KΩ, respectively.

Furthermore, as seen from this drawing, the thermal influence due to the self heating of the phase divider circuit 10a is largely different depending on the positions of the amplifiers GA8, GA4, GA2 and GA1.

For example, in the case where the signals with a frequency band for the PCS1900 are received and the phase divider circuit 10a is operated, if the amplifiers GA8, GA4, GA2 and GA1 of the gain control amplifier PGA11 are in the same layout as that of the other gain control amplifiers PGA12, PGA13 and PGA 21 to PGA23, more specifically, if the amplifier GA8 is laid out closest to the phase divider circuit 10a, then the amplifier GA8 with the highest gain is affected by the self heating of the phase divider circuit 10a, thereby resulting in the generation of the DC offset drift.

Therefore, the amplifiers GA8, GA4, GA2 and GA1, constituting the gain control amplifier PGA11 on a first stage closest to the phase divider circuit 10a, are laid out so that their gains may be small as they are close to the phase divider circuit 10a. Thereby, it is possible to prevent the amplifier GA8 with the highest gain from being affected thermally and also to reduce the DC offset drift.

Thus, according to this embodiment, since the DC offset drift is largely reduced, the receiving sensitivity of the mobile communication system can be improved and also the reduction of power consumption can be achieved.

In the foregoing, the invention made by the inventor of the present invention has been concretely described based on the embodiments. However, needless to say, the present invention is not limited to the foregoing embodiments and can be variously modified and changed without departing from the gist thereof.

The advantages achieved by the typical ones of the inventions disclosed in this application will be briefly described as follows.

(1) It is possible to largely improve the DC offset drift and further improve the receiving sensitivity to the received signals.

(2) Also, since the operation of the mixer section in advance before the receiving mode becomes unnecessary, the current consumption in the semiconductor integrated circuit device can be reduced.

What is claimed is:

1. A semiconductor integrated circuit device comprising a mixer section including a gilbert cell circuit demodulating a received signal and converting it into a voice-band signal,
    wherein each of transistors included in said gilbert cell circuit has a configuration in which a first and second transistor sections each including one or more transistors for multiple layout are connected in parallel, and
    in a layout on a semiconductor chip, at least the transistors on an upper stage in said gilbert cell circuit are such that said first transistor section and said second transistor section are arranged in a crisscross shape.

2. The semiconductor integrated circuit device according to claim 1,
    wherein the transistors for multiple layout provided in said first and second transistor sections each are an even number in number.

3. The semiconductor integrated circuit device according to claim 1,
    wherein the transistor for multiple layout provided in either of said first or second transistor section is an odd number in number.

4. The semiconductor integrated circuit device according to claim 1,
    wherein transistors constituting a lower stage of said gilbert cell circuit are such that said first transistor section and said second transistor section are arranged in a crisscross shape in the layout on said semiconductor chip.

5. The semiconductor integrated circuit device according to claim 4,
    wherein the transistors for multiple layout provided in said first and second transistor sections are an even number in number.

6. A semiconductor integrated circuit device comprising:
    a mixer section demodulating a received signal and converting it into a voice band signal;
    an amplifier section amplifying the signal outputted from said mixer section and outputting it; and
    a phase divider section generating an orthogonal signal and outputting it to said mixer section,
    wherein said amplifier section includes: a plurality of variable amplifiers provided with two or more amplifier circuits each having different gain; and an amplifier provided on a last stage, connected to said amplifier circuit in series, and having a fixed gain, and
    in a layout on a semiconductor chip, a phase divider section is arranged between said mixer section and said amplifier section, and the amplifier circuits provided in first-stage variable amplifiers are arranged so that their gains become small as they are close to said phase divider section.

7. The semiconductor integrated circuit device according to claim 6,
    wherein said mixer section includes a gilbert cell circuit,
    each of transistors included in said gilbert cell circuit has a configuration in which a first and second transistor sections each including one or more transistors for multiple layout are connected in parallel, and
    in the layout on the semiconductor chip, at least the transistors on an upper stage in said gilbert cell circuit are such that said first transistor section and said second transistor section are arranged in a crisscross shape.

8. The semiconductor integrated circuit device according to claim 7,
    wherein the transistors for multiple layout provided in said first and second transistor sections are an even number in number.

9. The semiconductor integrated circuit device according to claim 7,
    wherein the transistor for multiple layout provided in either of said first or second transistor section is an odd number in number.

10. The semiconductor integrated circuit device according to claim 7,
    wherein transistors constituting a lower stage of said gilbert cell circuit are such that said first transistor section and said second transistor section are arranged in a crisscross shape in the layout on the semiconductor chip.

11. The semiconductor integrated circuit device according to claim 10,
    wherein the transistors for multiple layout provided in said first and second transistor sections are an even number in number.

* * * * *